(12) United States Patent
Thevasahayam

(10) Patent No.: US 9,416,311 B2
(45) Date of Patent: Aug. 16, 2016

(54) BORON CHAIN EMBEDDED CARBON NANOTUBES

(71) Applicant: Arockiadoss Thevasahayam, Tamilnadu (IN)

(72) Inventor: Arockiadoss Thevasahayam, Tamilnadu (IN)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/399,277

(22) PCT Filed: Nov. 26, 2012

(86) PCT No.: PCT/IB2012/056721
§ 371 (c)(1),
(2) Date: Nov. 6, 2014

(87) PCT Pub. No.: WO2013/167941
PCT Pub. Date: Nov. 14, 2013

(65) Prior Publication Data
US 2015/0140342 A1    May 21, 2015

(30) Foreign Application Priority Data
May 7, 2012   (IN) .......................... 1777/CHE/2012

(51) Int. Cl.
| | | |
|---|---|---|
| *H01L 51/54* | (2006.01) | |
| *C09K 11/06* | (2006.01) | |
| *C09K 11/63* | (2006.01) | |
| *C09K 11/65* | (2006.01) | |
| *H01L 51/00* | (2006.01) | |
| *H01L 51/50* | (2006.01) | |
| *H05B 33/14* | (2006.01) | |
| *C03C 17/22* | (2006.01) | |
| *C03C 17/34* | (2006.01) | |

(52) U.S. Cl.
CPC ................. *C09K 11/65* (2013.01); *C03C 17/22* (2013.01); *C03C 17/3411* (2013.01); *C09K 11/63* (2013.01); *H01L 51/0048* (2013.01); *H01L 51/502* (2013.01); *H05B 33/14* (2013.01)

(58) Field of Classification Search
None
See application file for complete search history.

(56) References Cited

U.S. PATENT DOCUMENTS

| | | |
|---|---|---|
| 5,717,292 A | 2/1998 | Jin et al. |
| 6,888,660 B2 | 5/2005 | Bussmann et al. |
| 7,332,222 B2 | 2/2008 | Luzzi et al. |
| 2002/0180373 A1 | 12/2002 | Park |
| 2009/0035555 A1 | 2/2009 | Brahim et al. |
| 2009/0253580 A1 | 10/2009 | Pfefferle et al. |
| 2011/0007560 A1 | 1/2011 | Dieny et al. |

FOREIGN PATENT DOCUMENTS

WO    2008057615 A2    5/2008

OTHER PUBLICATIONS

International Search Report and Written Opinion for PCT/IB2012/056721 dated May 7, 2013.
Baibarac et al., Electrochemically Functionalized Carbon Nanotubes and their Application to Rechargeable Lithium Batteries, *Small* (2006), 2(8-9): 1075-1082.
Borowiak-Palen et al., Synthesis and electronic properties of B-doped single wall carbon nanotubes, *Carbon* (Jan. 25, 2004), 42(5-6):1123-1126.
Chan et al., Role of extrinsic atoms on the morphology and field emission properties of carbon nanotubes, *Applied Physics Letters* (Jun. 16, 2003), 82(2):4334-4336.
Diffusion Lens Module, Light Enhancer Cap, accessed at http://www.enplas.co.jp/english/wp/wp-content/themes/enplas_en/images/led/lec.pdf, accessed on Nov. 3, 2014, pp. 2.
FTO Glass Substrate (TEC 70) 100×100×3.2 mm, R:58-72 ohm/sq 25pcs /pack, accessed at http://web.archive.org/web/20110910035919/http://www.mtixtl.com/yszceramicsubstrate10x10x05mmonesidepolished-2-4-1-1-1.aspx, accessed on Nov. 3, 2014, pp. 2.
Handuja et al., Growth of Nitrogen-Containing Carbon Nanotubes by Thermal Chemical Vapor Deposition, *Synthesis and Reactivity in Inorganic, Metal-Organic, and Nano-Metal Chemistry* (Aug. 6, 2007), 37(6): 485-487.
Hsu et al., Boron-doping effects in carbon nanotubes, *J. Mater. Chem.* (Apr. 25, 2000), 10:1425-1429.
Hu et al., Prediction of Formation of Cubic Boron Nitride Nanowires inside Silicon Nanotubes, *J. Phys. Chem. C* (Nov. 4, 2010), 114(7):19941-19945.
Ito Coated Glass, Ito Coated Glass Suppliers and Manufacturers at Alibaba.com, accessed at http://www.alibaba.com/showroom/ito-coated-glass.html, accessed on Nov. 3, 2014, pp. 1-7.
Li et al., Structures and Electronic. Optical Properties of Hydrogen Nanowires Encapsulated in Single-walled Boron Nitride Nanotubes, *Journal of Materials Science & Technology* (2010), 26(6):542-546.
Rosolen et al., Electron field emission from composite electrodes of carbon nanotubes-boron-doped diamond and carbon felts, *Applied Physics Letters* (Feb. 23, 2006), 88(8):083116:1-083116:3.
Rubio et al., Theoretical study of one-dimensional chains of metal atoms in nanotubes, *Physical Review B* (Feb. 16, 1996—I), 53(7):4023-4026.
Sharma et al., Field emission properties of boron and nitrogen doped carbon nanotubes, *Chemical Physics Letters* (Jul. 1, 2006), 428(1-3):102-108.
Terrones et al., Doped Carbon Nanotubes: Synthesis, Characterization and Applications, *Carbon Nanotubes, Topics in Applied Physics* (2008), 111:531-566.

(Continued)

*Primary Examiner* — Andrew K Bohaty
(74) *Attorney, Agent, or Firm* — Pepper Hamilton LLP

(57) ABSTRACT

Compositions comprising boron chain embedded carbon nanotubes, methods of making, and methods of using are provided. Electroluminescent compositions comprising the same are also provided.

21 Claims, 2 Drawing Sheets

(56) References Cited

OTHER PUBLICATIONS

Williams et al., Boron-doped carbon nanotube coating for transparent, conducting, flexible photonic devices, *Applied Physics Letters* (Oct. 3, 2007), 91(14): 143116:1-143116:3.

Zettl et al., Boron Nitride Nanotube Peapods, AIP conference proceeding, 633:140-144.

Zhao et al., Carbon Nanowire Made of a Long Linear Carbon Chain Inserted Inside a Multiwalled Carbon Nanotube, *Physical Review Letters* (May 9, 2003), 90(18):187401:1-187401:4.

Diffusing Lens Modules for LED, accessed at http://www.enplas.co.jp/english/business/led_product//, pp. 3 (Dec. 23 13, 2015).

Develops New LED, Wins $30,000 Lemelson-Rensselaer Prize, accessed at http://web.archive.org/web/20110313131304/http://news.rpi.edu/update.do?artcenterkey=2406, pp. 2 (Feb. 28, 2008).

Chen and Tsai, Growth and field emission of carbon nanotubes on gated structured, acccesed at http://web.archive.org/web/20040701000000*/http://rdweb.adm.nctu.edu.tw/report/upload/2nd/03D042_p.doc, pp. 21 (Dec. 23, 2015).

Chen and Tsai et al., The characterization of boron-doped carbon nanotube arrays, Diamond and Related Materials,12(9) pp. 1500-1504 (Sep. 2003).

Fiederling et al., Injection and detection of a spin-polarized current in a light-emitting diode, Letters to nature, (402) pp. 787-790 (Dec. 16, 1999).

Gerhardt et al., Ultrafast circular polarization oscillations in spin-polarized verticalcavity surface-emitting laser devices, Proceedings of SPIE—The International Society for Optical Engineering, pp. 1-10 (Feb. 25, 2010).

International Search Report and Written Opinion for International Application No. PCT/IB2014/060217 mailed Sep. 12, 2014.

MA, Resonant Spin Polarization in a Two-Dimensional Hole Gas: Effect of the Luttinger term, structural inversion asymmetry and Zeeman splitting, Modern physics Letters B, 25(15) pp. 1259-1270 (Nov. 2011).

Manago and Akinaga, SPIN-polarized light emitting diode using metal/insulator/semiconductor structures, Applied Physics letters, 81(4) pp. 1-4 (Jul. 16, 2002).

BORON CHAIN EMBEDDED CARBON NANOTUBES

CROSS-REFERENCE TO RELATED APPLICATIONS

This application is a 35 U.S.C. §371 national phase application of PCT Application No. PCT/IB2012/056721, filed Nov. 26, 2012, which claims priority to Indian Patent Application No. 1777/CHE/2012, filed May 7, 2012, each of which is hereby incorporated by reference in its entirety.

TECHNICAL FIELD

Boron chain embedded carbon nanotubes and methods for preparing boron chain embedded carbon nanotubes are provided.

BACKGROUND OF DISCLOSURE

There are many approaches for large area lighting, such as OLED, inorganic LED arrays with polymer based diffusive surfaces to provide uniform backlighting for displays, and other applications. OLEDs in general have lifetime issues and are expensive. White inorganic LEDs are still expensive and need diffusers to provide uniform illumination. CCFLs are bulky and usually contain toxic mercury and have low life, and power hungry. Electroluminescent based lighting is inexpensive, simple to operate and fabricate, but their efficiency is typically low, and they are usually monochromatic. Therefore, there is a need for better materials that can provide uniform white light over large areas and also be simple to manufacture. The compositions and methods for making the compositions described herein fulfill these needs and others.

SUMMARY OF THE DISCLOSURE

Compositions comprising a boron chain embedded carbon nanotube are provided. In some embodiments, the composition is an electroluminescent composition.

Methods of preparing a boron chain embedded carbon nanotube are provided. In some embodiments, the method comprises contacting a hydrocarbon gas and boron gas in a furnace comprising a mischmetal to yield the boron chain embedded carbon nanotube.

Systems for producing a boron chain embedded carbon nanotube are provided. In some embodiments, the system comprises a gas inlet; a gas outlet; a boron gas generator; a furnace; a quartz tube; and a water trap. In some embodiments, the gas inlet and boron gas generator are connected to a first side of the furnace such that a first gas and a product of the boron gas generator can enter the furnace simultaneously; wherein the gas outlet is connected to a second side of the furnace and the water trap; and wherein the quartz tube is inside the furnace.

Methods of affixing a boron chain embedded carbon nanotube onto a FTO glass plate are provided. In some embodiments, the method comprises dispersing the boron chain embedded carbon nanotube in a solvent; coating the Fluorine-Tin-Oxide (FTO) glass plate with the dispersed boron chain embedded carbon nanotube; and evaporating the solvent to yield boron chain embedded carbon nanotube coated FTO glass plate.

Methods of making an electroluminescent composition are provided. In some embodiments, the method comprises contacting an indium-tin-oxide (ITO) glass plate with a boron chain embedded carbon nanotube coated FTO glass plate. In some embodiments, a gap of about 0.18 mm is maintained between the coated FTO glass plate and the ITO glass plate.

Methods of generating light are provided. In some embodiments, the method comprises passing current through a composition described herein.

Lights comprising a boron chain embedded carbon nanotube are provided. In some embodiments, the light generates pure white light.

DETAILED DESCRIPTION OF DISCLOSURE

Figure 1:
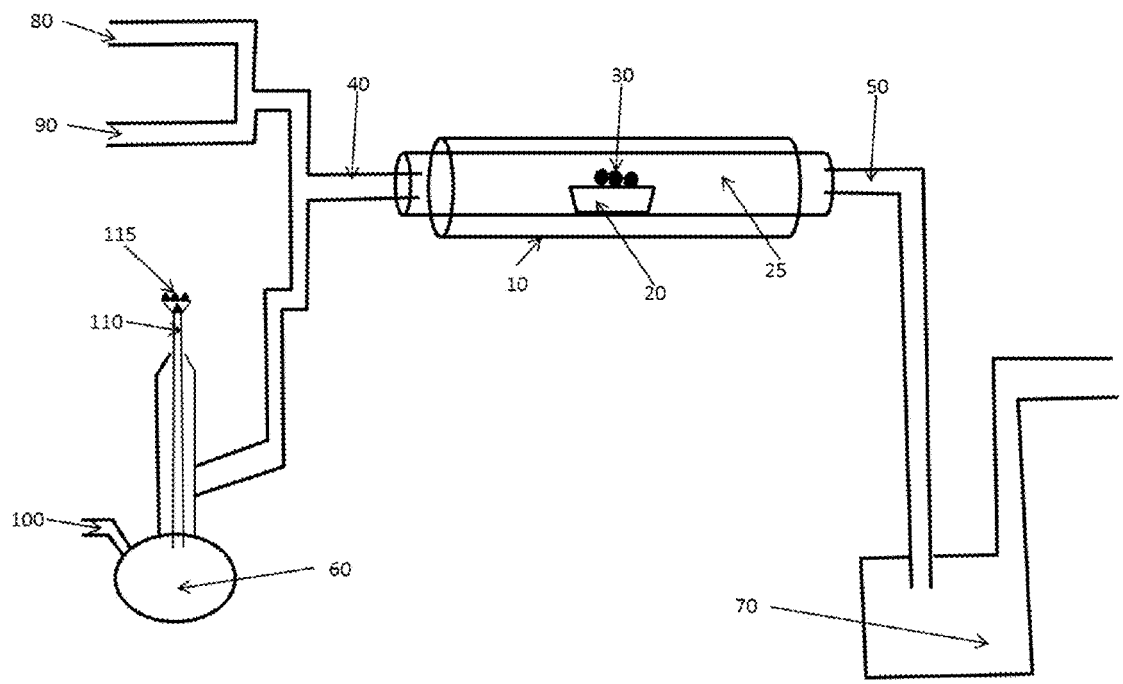
FIG. 1 illustrates a non-limiting example of a system for creating a boron embedded carbon nanotube.

This description is not limited to the particular processes, compositions, or methodologies described, as these may vary. The terminology used in the description is for the purpose of describing the particular versions or embodiments only, and it is not intended to limit the scope of the embodiments described herein. Unless defined otherwise, all technical and scientific terms used herein have the same meanings as commonly understood by one of ordinary skill in the art. In some cases, terms with commonly understood meanings are defined herein for clarity and/or for ready reference, and the inclusion of such definitions herein should not necessarily be construed to represent a substantial difference over what is generally understood in the art. However, in case of conflict, the patent specification, including definitions, will prevail.

It must also be noted that as used herein and in the appended claims, the singular forms "a", "an", and "the" include plural reference unless the context clearly dictates otherwise.

As used in this document, terms "comprise," "have," and "include" and their conjugates, as used herein, mean "including but not limited to." While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

Embodiments described herein provide compositions or compounds comprising a boron chain embedded carbon nanotube. In some embodiments, the composition is an electroluminescent composition.

As used herein, the term "electroluminescent composition" refers to a composition that generates light when electricity is applied to the composition. In some embodiments, the light is white light. In some embodiments, the light is essentially pure white light. In some embodiments, the light is pure white light. In some embodiments, the boron embedded carbon nanotube generates pure white light or essentially pure white light when an electrical field is applied to the carbon nanotube. In some embodiments, the boron embedded carbon nanotube generates a light other than pure white light. The color of the light can be modified by, for example, doping the carbon nanotube with multivalent transition metal nanoparticles. Examples of transition metal nanoparticles, include, but are not limited to, platinum, palladium, gold, silver, vanadium, and the like. The nanotube can be doped with one or a combination of different transition metal nanoparticles. The carbon nanotube can also be doped with, for example, nitrogen, oxygen, halogens (such as F, Cl, Br, or I), or a combination thereof. The doping of the nanotube will change the wavelength of the light, therefore, allowing the color to be modified.

In some embodiments, the carbon nanotube is coated onto a conducting oxide. In some embodiments, the conducting oxide is a transparent conducting oxide. In some embodiments, the transparent conducting oxide is about 10, 20, 30, 40, 50, 60, 70, 80, 90, 95 or 100% transparent. In some embodiments, the transparent conducting oxide is at least 50, 60, 70, 80, 90, or 95% transparent. In some embodiments, the transparent conducting oxide is at least 80% transparent.

In some embodiments the conducting oxide has a conductivity of about 1 ohm to about 50 ohms. In some embodiments, the conducting oxide has a conductive of about 5 ohms to about 50 ohms, about 10 ohms to about 50 ohms, about 20 ohms to about 50 ohms, about 30 ohms to about 50 ohms, or about 40 ohms to about 50 ohms. Specific examples of conductivity include about 5 ohms, about 10 ohms, about 20 ohms, about 30 ohms, about 40 ohms, about 50 ohms, and ranges between any two of these values. In some embodiments, the conductivity is lower than 50 ohms.

Examples of a conductive oxide include, but are not limited to Fluorine-Tin-Oxide (FTO), indium-tin-oxide (ITO), and the like. In some embodiments, the nanotube is coated onto a conducting oxide glass plate. In some embodiments, the glass plate is a FTO or ITO glass plate. In some embodiments, the composition comprises a FTO glass plate and an ITO glass plate. In some embodiments, the carbon nanotube is coated onto a flexible plastic to make, for example, a flexible illuminating display. The compositions described herein, can be used for general lighting, displays, or backlighting objects, such as displays.

In some embodiments, the conducting glass plates (e.g., the ITO glass plate and the FTO glass plate) are separated by a gap. In some embodiments, the gap is about 0.1 mm to about 0.2 mm. In some embodiments, the gap is about 0.15 mm to about 0.2 mm. In some embodiments, the gap is about 0.18 mm to about 0.2 mm. In some embodiments, the gap is about 0.18 mm. Specific examples of the gap include about 0.10 mm, about 0.11 mm, about 0.12 mm, about 0.13 mm, about 0.14 mm, about 0.15 mm, about 0.16 mm, about 0.17 mm, about 0.18 mm, about 0.19 mm, about 0.20 mm, and ranges between any two of these values. In some embodiments, the gap is a sufficient distance such that the intensity of the light being emitted is maximized. As the gap is increased the intensity of the light emitted by the carbon nanotube will decrease. Therefore, in some embodiments, the intensity of the light is modulated by increasing or decreasing the gap between the FTO and ITO layers.

Embodiments described herein also provide methods of preparing a boron chain embedded carbon nanotube. In some embodiments, the method comprises contacting at least one hydrocarbon gas and at least one boron gas in a furnace. In some embodiments, the boron gas is $B_3N_3H_6$. In some embodiments, the boron gas is $B_2O_3$ or $BCl_3$. The conditions described herein can be modified according the specific type of boron gas that is used. In some embodiments, the hydrocarbon gas is acetylene gas. In some embodiments, the hydrocarbon gas is methane. In some embodiments, the boron gas and the hydrocarbon gas are contacted with the furnace sequentially. In some embodiments, the boron gas and the hydrocarbon gas are contacted with the furnace concurrently (e.g. simultaneously).

As used herein, the term "furnace" refers to a device, structure, or apparatus where a reaction can take place, and, for example, the temperature can be modulated. The exact structure of the furnace can be modified to conform to the system and for the product being generated.

In some embodiments, the furnace comprises at least one metal catalyst. Without being bound to any particular theory the catalyst will facilitate the generation of the boron embedded carbon nanotube when the hydrocarbon gas is contacted with the boron gas in the presence of the metal catalyst. In some embodiments, the metal catalyst is mischmetal-nickel ($MmNi_6$), $MmNi_3$, Ni, Ru, Pt, Pd, mischmetal, or any combinations thereof. As used herein, the term "mischmetal" refers to an alloy of rare earth elements. In some embodiments, the catalyst is encapsulated or placed on a quartz substrate, such as, but not limited to, a quartz tube or quartz platform. In some embodiments, a quartz platform is placed in a quartz tube. The quartz tube can also be inside a furnace.

The temperature of the reaction may be varied depending upon the hydrocarbon gas that is used. The specific temperature can, therefore, be modified depending upon the specific hydrocarbon gas that is used to generate the boron embedded carbon nanotube. In some embodiments, the temperature is at least about 1100 degrees Celsius. In some embodiments, the temperature is about 1000° C. to about 1100° C., about 1025° C. to about 1100° C., about 1150° C. to about 1100° C., or about 1175° C. to about 1100° C. In some embodiments, the temperature is about 650° C. to about 800° C., about 675° C. to about 775° C., or about 700° C. to about 750° C. In some embodiments, the temperature is about 1050° C. to 1100° C. when acetylene gas is used. In some embodiments, the temperature is about 700° C. to about 750° C. when methane gas is used. In some embodiments, the temperature is about 550° C., 600° C., 650° C., 700° C., 750° C., 800° C., 850° C., 900° C., 950°C., 1000° C., 1050° C., or about 1100° C.

The pressure of the reaction can be also optionally be modified in order to control the reaction. In some embodiments, the pressure is about 5, 6, 7, 8, 9, or 10 bar (500, 600, 700, 800, 900, or 1000 kPa). The exact pressure used will depend upon the size of the furnace, but the pressure can be modified so that the pressure is sufficient for the preparation of the boron embedded carbon nanotubes.

In some embodiments, the furnace is heated to a temperature of about 500° C. to about 600° C., about 540° C. to about 560° C., or about 550 degrees Celsius prior to contacting the hydrocarbon gas with the catalyst. In some embodiments, the temperature is increased to about 1000° C. to about 1200° C., about 1000° C. to about 1150° C., about 1050° C. to about 1150° C., or about 1100 degrees Celsius. The temperature of the catalyst in the furnace can be increased, for example, at a rate of about 1, 2, 3, 4, 5, 6, 7, 8, 9, or 10 degrees Celsius per minute.

In some embodiments, hydrogen gas is passed through the furnace during the reaction of making the boron embedded carbon nanotube. In some embodiments, the hydrogen is continuously passed through the furnace. In some embodiments, the gas is passed through the furnace at a pressure of about 1, 2, 3, 4, or 5 bar. The pressure that is used will be determined by the size of the furnace and can be modulated (e.g. increased or decreased) as appropriate for the conditions and the size of the furnace.

In some embodiments, the method comprises generating the boron gas. In some embodiments, the method comprises contacting a boron salt and a reducing agent in the presence of an inert gas under conditions sufficient to produce a boron gas. Examples of a boron salt include, but are not limited to, sodium borohydride, boron trifluoride, diethyl etherate boronic acid, boron nitrate, and the like. Examples of reducing agents, include, but are not limited to, ammonium sulfate, potassium permanganate, hydrazine, hydrogen peroxide, and the like. Any inert gas can be used in creating the boron gas. Examples of inert gases include, but are not limited to, argon gas, helium gas, neon gas, krypton gas, xenon gas, radon gas, nitrogen gas, and the like. In some embodiments, the method comprises contacting sodium borohydrate and ammonium sulfate in the presence of argon.

In some embodiments, the method of generating a boron gas comprises contacting the boron salt and the reducing agent, in a container comprising a high boiling point electronegative non-volatile electrolyte and iodide. In some embodiments, the iodide is $I_2$ or tri-iodide. In some embodiments, the electronegative non-volatile electrolyte is tetraglyme, $B_2O_3$, $BF_3$, $BCl_3$, $BBr_3$, $BI_3$, or any combination thereof.

In some embodiments, the boron chain embedded carbon nanotube is affixed to a glass plate, such as one coated with FTO. Therefore, in some embodiments, a method of affixing a boron chain embedded carbon nanotube onto a FTO glass plate is provided. In some embodiments, the method comprises dispersing the boron chain embedded carbon nanotube in a solvent; coating a Fluorine-Tin-Oxide (FTO) glass plate with the dispersed boron chain embedded carbon nanotube; and evaporating the solvent to yield boron chain embedded carbon nanotube coated FTO glass plate. In some embodiments, the solvent is an alcohol or an alkyl alcohol. In some embodiments, the solvent is ethanol, methanol, isobutanol, isopropanol, DMF, toluene, benzene, $CCl_4$, or combinations thereof.

The nanotubes can optionally be dispersed in the solvent so that the nanotubes can be uniformly coated/deposited onto the glass plate. In some embodiments, the nanotube is dispersed in the solvent by sonication. After the solvent containing the nanotube is deposited onto the glass plate, the solvent can be evaporated. The solvent can be evaporated by, for example, heating the plate at a temperature to evaporate the solvent. In some embodiments, the plate is heated to a temperature of at least 100 degrees Celsius. In some embodiments, the plate is heated to a temperature of at about 100° C. to about 120 degrees Celsius. In some embodiments, the plate is heated to a temperature of no more than 120 degrees Celsius. In some embodiments, the plate is baked at a temperature sufficient to remove the solvent. The baking can facilitate the evaporation of the solvent and can be done at any temperature that is sufficient to remove the solvent without damaging the plate or the nanotube, such as temperatures described herein. In some embodiments, the plate is heated, for example, on a hot plate to remove some of the solvent and then baked at a higher temperature to remove all of, or substantially all of, the solvent. In some embodiments, the plate is heated at a temperature of about 200 degrees Celsius to remove sufficiently all of the solvent.

The nanotube can be coated onto the glass plate. In some embodiments, the nanotube is coated onto the glass plate by spin coating. Any method can be used to uniformly coat the glass plate with the nanotube.

Embodiments of methods of making an electroluminescent composition are also provided. In some embodiments, the method comprises contacting an indium-tin-oxide (ITO) glass plate with a boron chain embedded carbon nanotube coated FTO glass plate, wherein a gap is maintained between the coated FTO glass plate and the ITO glass plate. The gap between the plates can be adjusted to modulate the intensity of the light. Examples of the size of the gap between the plates are described herein.

Embodiments of methods of generating light are provided. In some embodiments, a method of generating light is provided. In some embodiments, the method comprises passing electrical current through a composition described herein. The composition can be, for example, an FTO plate and/or ITO plate coated with boron embedded carbon nanotube, including, but not limited to, the compositions described herein. In some embodiments, the method generates pure white light. In some embodiments, the method produces light that has a brightness of about 50 lumens to about 60 lumens. The brightness, however, can also be more than 50 to 60 lumens as well. In some embodiments, the method produces light that has a has a brightness of at least 10 lumens, about 20 lumens, about 30 lumens, about 40 lumens, or about 50 lumens. In some embodiments, the current is at a power of less than 2.0 W per 4 $cm^2$ of the composition at a voltage of about 7.0V.

Embodiments of lights are also provided. In some embodiments, the light comprises a boron chain embedded carbon nanotube. In some embodiments, the light comprises a boron chain embedded carbon nanotube made by a method described herein. In some embodiments, the light comprises a boron chain embedded carbon nanotube made by a system described herein.

In some embodiments, systems for producing a boron chain embedded carbon nanotube are provided. In some embodiments, the system comprises a gas inlet; a gas outlet; a boron gas generator; a furnace; a quartz tube; and a water trap. In some embodiments, the gas inlet and boron gas generator are connected to a first side of the furnace such that a first gas and a product of the boron gas generator can enter the furnace simultaneously, wherein the gas outlet is connected to a second side of the furnace and the water trap; and wherein the quartz tube is inside the furnace. In some embodiments, a method of generating a boron chain embedded carbon nanotube is provided, wherein the method comprises contacting a hydrocarbon gas and a boron gas in a system described herein to yield the boron chain embedded carbon nanotube. The systems can be adapted or used with, for example, the methods described herein.

FIG. 1 illustrates a non-limiting example of a system that can be used to make boron chain embedded carbon nanotubes. FIG. 1 illustrates a furnace 10 with a quartz substrate 20 inside of a quartz tube 25. FIG. 1 illustrates a metal catalyst 30 present on a quartz substrate. FIG. 1 also illustrates the furnace connected to a gas inlet 40 and a gas outlet 50. FIG. 1 also illustrates a system with a boron gas generator 60. The boron gas generator can, for example, be connected to the furnace through the gas inlet. FIG. 1 also illustrates a system comprising a water bath 70 that is used to facilitate the flow of gases through the system. FIG. 1 also illustrates a system comprising a port 80 for the introduction of a hydrocarbon gas and a port 90 for the introduction of hydrogen gas. FIG. 1 also illustrates a port 100 for the introduction of an inert gas into the boron gas generator and a port 110 for the introduction of an electronegative non-volatile electrolyte 115. The system illustrated in FIG. 1 is only one example and many other types of systems can be used to make boron chain embedded carbon nanotubes.

Embodiments are now described with reference to the following examples. These examples are provided for the purpose of illustration only and the embodiments should in no way be construed as being limited to these examples, but rather should be construed to encompass any and all variations which become evident as a result of the teaching provided herein. Those of skill in the art will readily recognize a variety of non-critical parameters that could be changed or modified to yield essentially similar results.

EXAMPLES

Example 1

Boron Gas Preparation

The boron gas was generated in a separate setup, with a 1 liter round bottom three neck flask. The left neck was supplied with Argon gas at 1.5 bar, the middle one is used for dropping 50 mM (milli molar) of tri-iodide in 100 mL tetraglyme solution (a high boiling point electronegative non volatile electrolyte). This setup allows drop-by-drop of the electrolyte. Generation of boron gas is from a composition of 15 g of sodium borohydride ($NaBH_4$) and 13 g of ammonium sulphate $[(NH_4)_2SO_4]$ in the bottom of the flask. The right most neck is used to carry the boron gas into the furnace with the help of Argon gas as the carrier. The reaction was carried out a temperature of 135 degrees Celsius. The reaction to generate the boron gas can be shown as follows:

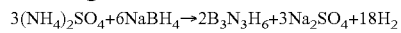

$$3(NH_4)_2SO_4 + 6NaBH_4 \rightarrow 2B_3N_3H_6 + 3Na_2SO_4 + 18H_2$$

Example 2

Boron-Chain Embedded in Carbon Nanotube

A one-stage tubular muffle furnace of diameter 25.4 mm and length 220 mm was used. Inside the muffle a quartz-tube of inner diameter 14 mm is placed. $MmNi_3$ (5 mg) was placed inside the quartz tube. The temperature of the muffle furnace was raised to 550 degrees Celsius at a rate of 5 degrees per minute. Once a steady state temperature of 550 degrees Celsius was reached, the muffle furnace was passed with hydrogen gas at 2 bar continuously. The temperature of the furnace was then raised to 1100 degrees Celsius at a rate of 5 degrees per minute. Once a steady state temperature of 1100 degrees Celsius was reached, the furnace was supplied simultaneously with acetylene gas at 3 bar (300 kPa) and boron gas carried by argon gas from the three neck flask described in Example 1.

Example 3

Spin Coating of Boron Chain Embedded Carbon Nanotube on FTO Coated Plate 5 mg of boron chain embedded carbon nanotube was dispersed in 10 ml of ethanol in a bath sonicator for 10 minutes at a power level of 850 watts. The FTO glass plate of 2 cm×2 cm (4 $cm^2$) was placed upon the spin-coating apparatus, cleaned with acetone and then methanol using lint-free swabs, and followed up with iso-propanol, then coated liberally with the above nanotube-ethanol solvent solution by use of eyedropper. The plate was spun at a low speed of 300 rpm for 5 minutes to evenly spread the solution. Once the spin-coating was complete, the plate was placed quickly onto a hot plate (heated to approximately 100 degrees Celsius) for several seconds to initially evaporate solvent and solidify the coating. The slide was then baked-out for 2-3 hours, in a vacuum oven, at a temperature of 200 degrees Celsius to sufficiently remove the remaining solvent. This Example generated a boron embedded carbon nanotube that is coated onto a plate.

Example 4

Electroluminescent Sample

An ITO coated glass plate of size 2 cm×7 cm was placed on top of the FTO coated Boron-chain embedded carbon nanotube using spacers such that a gap of 0.18 mm was maintained between the FTO and the ITO electrode surfaces. Current was passed across the electroluminescent sample to generate light including pure white light. The electroluminescent composition was tested for about 4 weeks without any visual loss of brightness, in normal atmosphere on a table top. Thus it is expected that the lifetime will be high, low cost and simple process for manufacture without a need for special packaging requirements, which makes this an easily adoptable technology.

The tests were performed on a boron chain inside the carbon nanotube. The FTO (Fluorine Tin oxide) was chosen as the anode and the ITO (Indium tin oxide) was chosen as the cathode. FTO and ITO were chosen because of the transparent conducting electrodes. The ITO electrode was placed at a distance of 0.18 mm from the FTO surface. The anode current is measured as a function of anode-to-cathode voltages. The voltage is varied from 0 V to 15 V DC with an interval of 1 V to study the I-V property/characteristics of the boron chain embedded carbon nanotube. The results demonstrated the presence of an ohmic contact between FTO and Boron-chain embedded carbon nanotube that emits white light and acts as an electroluminescent panel, in the presence of low voltage electric field. It was observed that the electroluminescence of the film initiates at a current density of 2.75 $mA/cm^2$ under an electric field of 11 V/cm. The experiments also surprisingly and unexpectedly revealed that the boron chain embedded carbon nanotube exhibited field emission properties even at low electric fields, unlike other compositions such as boron or nitrogen doped carbon nanotubes that require 100 s of Volts, whereas the currently described composition require significantly much less voltage. This result could not have been predicted.

Without being bound to any theory, the influence of the boron chain on the π-electron cloud provides the requisite free electron density required for charge transport, which is seen in the ohmic behavior of the compositions. This implies this there is an overlap of conduction band and valence band—similar to a metal. Because of the carbon nanotube wrapped around boron, which makes this material behave more as a conductor rather than a semiconductor, the turn on field for this material is low. With a low applied field, the valence band and conduction band begins overlapping. This leads to higher the overlap at higher electric fields. Therefore, an increase in luminosity is observed with an increase in applied voltage. Because of relative loosening of the π-electron cloud away from the honeycomb carbon nanotube the field strength "E" required for the electrons to be tunneled through the annular gap between boron chain and CNT is quite low. This approach eliminates the need for high electric field to initiate electron emission from the material. This is an advantage of the compositions and methods described herein as compared to prior compositions.

In addition to the advantages described herein, the compositions and methods provide the following advantages. The material thus described above is advantageous because it requires low power consumption (such as 1.4 W for a 4 $cm^2$ material at 7.0V DC) for of about 50-60 lumens. Therefore, the composition can be used to generate light more efficiently and with less power. The lumens can also be improved by aligning the carbon nanotubes. The material is also better because there is no need for high electric field and vacuum for obtaining electroluminescence. Thus, the product can be used in many applications, such as but not limited to, general lighting, displays, backlighting, and others. Other advantages includes that the nanotube could be coated on any transparent conducting substrates such as ITO/FTO or it can be coated onto a plastic substrate to make a flexible illuminating panel. The process to make the electroluminescent composition is low cost and simple process to manufacture.

Example 5

A System for Generating a Boron Embedded Carbon Nanotube

Figure 2:
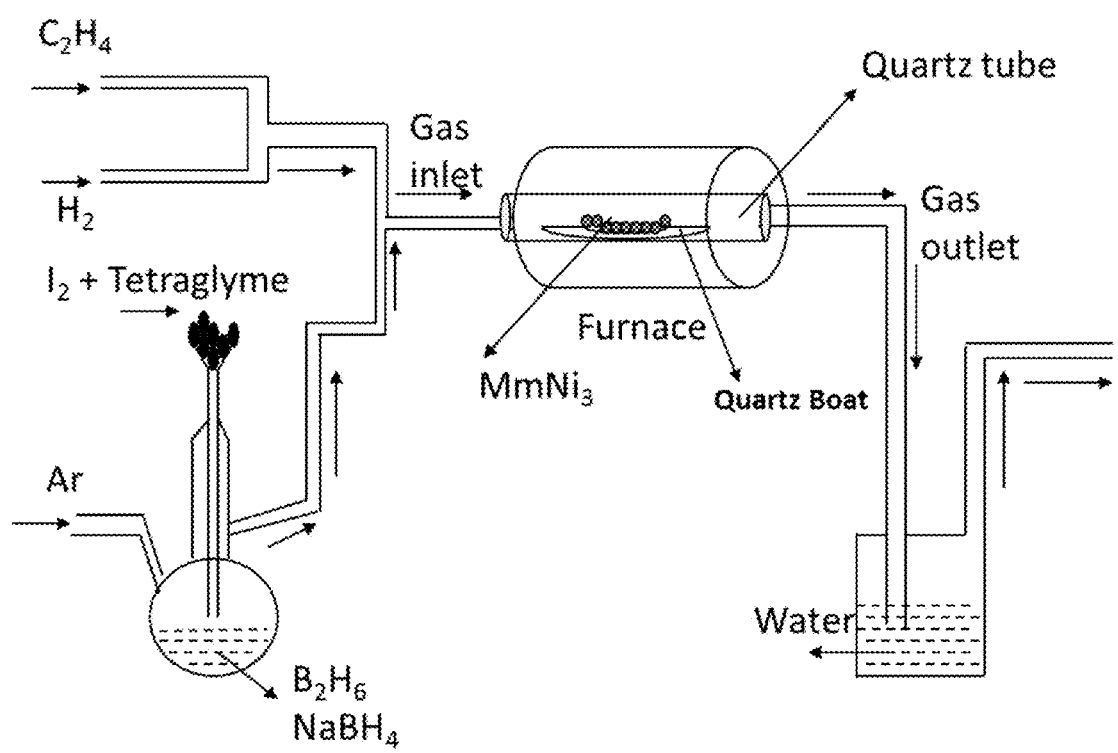
FIG. 2 illustrates a non-limiting example of a system for creating a boron embedded carbon nanotube.

FIG. 2 illustrates a non-limiting example of a system for making a boron embedded carbon nanotube. FIG. 2 shows ethylene gas and hydrogen being mixed with boron gas that is generated in the presence of Iodine and tetraglyme and introduced into the furnace. The furnace contains $MmNi_3$ with a quartz boat. The gases are then allowed to exit from the furnace and through a water bath. The boron embedded carbon nanotube is deposited in the furnace and can be recovered.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:

1. A composition comprising a boron chain embedded inside a carbon nanotube and an indium-tin-oxide (ITO) glass plate.

2. The composition of claim 1, wherein the composition is an electroluminescent composition.

3. The composition of claim 1, wherein the carbon nanotube is coated on a Fluorine-Tin-Oxide (FTO) glass plate.

4. The composition of claim 3, wherein the ITO glass plate and the FTO glass plate are separated by a gap of about 0.18 mm.

5. The composition of claim 1, wherein the composition generates pure white light upon being powered by an electrical current.

6. A method of preparing a boron chain embedded inside a carbon nanotube, the method comprising:
contacting a hydrocarbon gas and boron gas in a furnace comprising a metal catalyst to yield the boron chain embedded inside the carbon nanotube.

7. The method of claim 6, wherein the contacting comprises contacting a hydrocarbon gas and boron gas in a furnace comprising a mischmetal.

8. The method of claim 6, wherein the contacting comprises contacting a hydrocarbon gas and boron gas in a furnace at a temperature of at least about 1100 degrees Celsius and at a pressure of 6 bar (600 kPa).

9. The method of claim 6, wherein contacting comprises contacting a hydrocarbon gas and boron gas in a furnace comprising a metal catalyst-encapsulated by a quartz tube.

10. The method of claim 6, further comprising, prior to the contacting step, heating the furnace comprising the metal catalyst to a temperature of about 550 degrees Celsius at a rate of about 5 degrees Celsius per minute.

11. The method of claim 10, further comprising passing hydrogen gas through the furnace continuously at a pressure of about 2 bar (200 kPa).

12. The method of claim 6, further comprising generating the boron gas by contacting sodium borohydrate ($NaBH_4$) and ammonium sulphate ($(NH_4)_2SO_4$) in the presence of an inert gas under conditions sufficient to yield boron gas ($B_3N_3H_6$).

13. The method of claim 12, wherein generating comprises generating the boron gas by contacting sodium borohydrate ($NaBH_4$) and ammonium sulphate ($(NH_4)_2SO_4$) in the presence of argon gas under conditions sufficient to yield boron gas ($B_3N_3H_6$).

14. The method of claim 12, wherein the generating further comprises contacting sodium borohydrate and ammonium sulphate in a container comprising a high boiling point electronegative non-volatile electrolyte and iodide.

15. The method of claim 14, wherein the contacting comprises contacting sodium borohydrate and ammonium sulphate in a container comprising tetraglyme and iodide.

16. A system for producing a boron chain embedded inside a carbon nanotube, the system comprising:
a gas inlet;
a gas outlet;
a boron gas generator;
a furnace;
a quartz tube; and
a water trap,
wherein the gas inlet and boron gas generator are connected to a first side of the furnace such that a first gas from the gas inlet and a product from the boron gas generator enter the furnace simultaneously;
wherein the gas outlet is connected to a second side of the furnace via the water trap; and
wherein the quartz tube is situated inside the furnace.

17. The system of claim 16, wherein the system comprises a metal catalyst situated inside the quartz tube.

18. The system of claim 17, wherein the metal catalyst is situated on a quartz substrate situated inside the quartz tube.

19. The system of claim 16, further comprising a port for the introduction of a hydrocarbon gas connected to the gas inlet.

20. The system of claim 16, further comprising a port for the introduction of hydrogen gas connected to the gas inlet.

21. The system of claim 16, further comprising a port for the introduction of an inert gas into the boron gas generator.

* * * * *